(12) United States Patent
Roth et al.

(10) Patent No.: US 8,547,267 B2
(45) Date of Patent: Oct. 1, 2013

(54) IDLE TONE SUPPRESSION CIRCUIT

(75) Inventors: Alan Roth, Leander, TX (US); Eric Soenen, Austin, TX (US); Chia Liang Tai, Taichung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 13/481,990

(22) Filed: May 29, 2012

(65) Prior Publication Data

US 2013/0135131 A1    May 30, 2013

Related U.S. Application Data (60) Provisional application No. 61/565,082, filed on Nov. 30, 2011, provisional application No. 61/564,940, filed on Nov. 30, 2011, provisional application No. 61/565,306, filed on Nov. 30, 2011.

(51) Int. Cl.
*H03M 3/00* (2006.01)

(52) U.S. Cl.
USPC ........... 341/143; 341/118; 341/119; 341/120; 341/155

(58) Field of Classification Search
USPC ..................... 341/118, 119, 120, 143, 155
See application file for complete search history.

(56) References Cited

U.S. PATENT DOCUMENTS

| | | | |
|---|---|---|---|
| 5,465,268 A * | 11/1995 | Rainbolt | 375/333 |
| 6,225,926 B1 * | 5/2001 | Hayase | 341/110 |
| 6,956,516 B2 * | 10/2005 | Furuichi | 341/155 |
| 7,629,915 B2 * | 12/2009 | Lin | 341/166 |
| 7,646,659 B2 | 1/2010 | Sako | |
| 7,733,995 B2 * | 6/2010 | Usui | 375/350 |
| 7,898,448 B2 * | 3/2011 | Murakami et al. | 341/143 |
| 7,990,304 B2 * | 8/2011 | Lim et al. | 341/164 |
| 8,299,646 B2 * | 10/2012 | Rockenfeller et al. | 307/30 |
| 2007/0152865 A1 * | 7/2007 | Melanson | 341/155 |
| 2009/0313313 A1 * | 12/2009 | Yokokawa et al. | 708/300 |
| 2010/0331039 A1 * | 12/2010 | Hezar | 455/550.1 |

OTHER PUBLICATIONS

U.S. Appl. No. 13/546,303, filed Jul. 11, 2012.
U.S. Appl. No. 13/660,258, filed Oct. 25, 2012.

* cited by examiner

*Primary Examiner* — Linh Nguyen
(74) *Attorney, Agent, or Firm* — Duane Morris LLP (57) ABSTRACT

A hysteretic digital filter includes a first multi-bit flip-flop having an input for receiving a series of multi-bit sigma-delta ADC codes, a clock input for receiving a clock signal and an output; a second multi-bit flip-flop having an input coupled to the output of the first multi-bit flip-flop, an output for providing an output code of the digital filter, and an input for receiving a latch control signal, the second multi-bit flip-flop latching its input to its output under control of the latch control signal; and a control circuit. The control circuit is configured to selectively provide the latch control signal to trigger latching by the second multi-bit flip-flop dependent on a running comparison of the output code of the digital filter and the value of individual ones of the multi-bit sigma-delta ADC codes from the series of multi-bit sigma-delta ADC codes.

20 Claims, 9 Drawing Sheets

*FIG. 6*

IDLE TONE SUPPRESSION CIRCUIT

CROSS REFERENCE TO RELATED APPLICATIONS

This application is a non-provisional of and claims priority to U.S. Provisional Patent Application No. 61/565,082 filed Nov. 30, 2011 and entitled "Idle Tone Suppression Circuit", the entirety of which is hereby incorporated by reference herein.

This application is a non-provisional of and claims priority to U.S. Provisional Patent Application No. 61/564,940 filed Nov. 30, 2011 and entitled "Two-Point Calibration of Integrated Thermal Sensor", the entirety of which is hereby incorporated by reference herein.

This application is a non-provisional of and claims priority to U.S. Provisional Patent Application No. 61/565,306 filed Nov. 30, 2011 and entitled "On Demand Variable Precision Thermal Sensor", the entirety of which is hereby incorporated by reference herein.

TECHNICAL FIELD

The present disclosure relates to techniques for suppression of inherent artifacts of sigma-delta analog-to-digital converters (ADC).

BACKGROUND

Sigma-delta analog-to-digital converters (ADC) are well known in the art. These ADCs oversample an input and then reconstruct that input. The ADC digitizes the amount of error by integration. Digital information (e.g., a bit) can be left from the sampling process and this left over information remains on the integration capacitors and adds up, eventually causing an improper increase or decrease to the next quantization level. These artifacts appear as an incorrect digital output code. Extra filtering, such as by digital sinc filters, of the output is required to remove the false outputs. However, these filters require large gate counts, consuming large silicon area and power.

BRIEF DESCRIPTION OF THE DRAWINGS

The accompanying drawings illustrate embodiments, as well as other information pertinent to the disclosure, in which.

DETAILED DESCRIPTION

This description of the exemplary embodiments is intended to be read in connection with the accompanying drawings, which are to be considered part of the entire written description. This description of certain exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Figure 1:
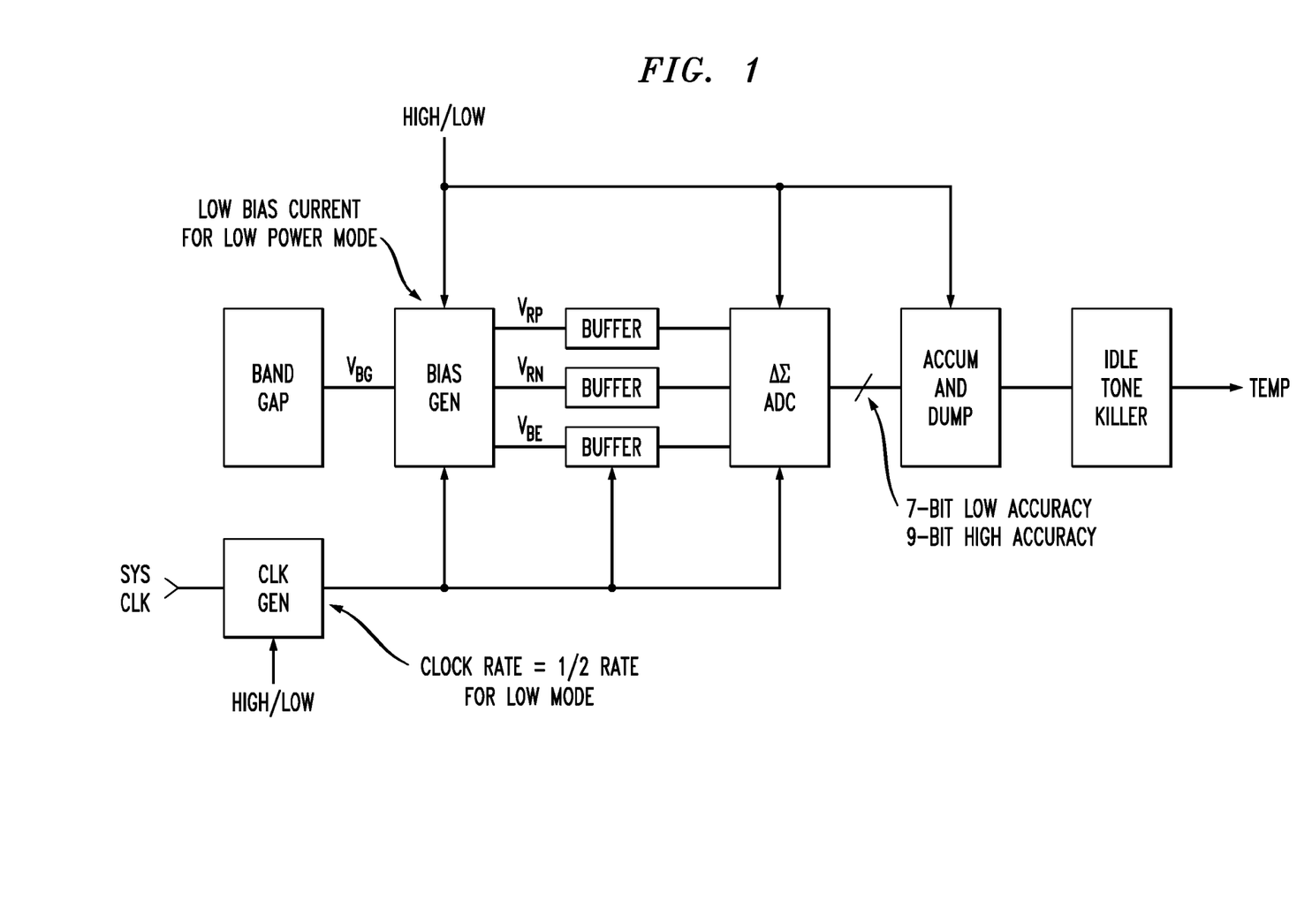
FIG. 1 illustrates an integrated circuit temperature sensor using a sigma-delta ADC.

FIG. 1 illustrates an integrated circuit temperature sensor using a sigma-delta ADC. Details regarding the operation of the integrated circuit temperature sensor can be found in U.S. Provisional Patent Application No. 61/564,940 referenced and incorporated by reference above.

Of particular note, the temperature sensor includes a digital filter block labeled Idle Tone Killer, which accepts sigma-delta ADC digital output codes from the Accumulate and Dump block, determines if an individual code is valid or not, and outputs a digital code based on that determination. The digital filter that employs hysteresis to determine if an output code change is really the product of change in the input level or rather the product of leftover accumulated (i.e., idle) information from the quantization process. If it is determined that there truly was a change, then the changed code is outputted by Idle Tone Killer. Otherwise, if it determined that the change was a result of left over information, the change is rejected and the outputted code remains unchanged.

The techniques described herein are useful in sampling a DC or nearly DC input condition, meaning conditions that change at low frequencies or infrequently. Good examples includes pressure and temperature sensors where a DC voltage represents the measured value. Silicon sensors are particularly well suited for detecting these conditions. The technique suppresses false information that would trigger a change in the output code. By way of example only, a temperature reading of a voltage corresponding to 27.1° should result in an output code corresponding to 27°. This means that there is a leftover quantization error amount of 0.1. If this reading is taken for several consecutive samples, the extra 0.1 can accumulate and cause a false reading eventually of 28° when the temperature is still only of 27.1° (i.e., after the tenth sampling which would accumulate an extra 1.0, assuming a digital output having a precision of 1.0° and the digital output is truncated and not rounded). The idle tone killer recognizes this situation—based on the history of the readings—and maintains the output code as corresponding to 27°.

Figure 2A:
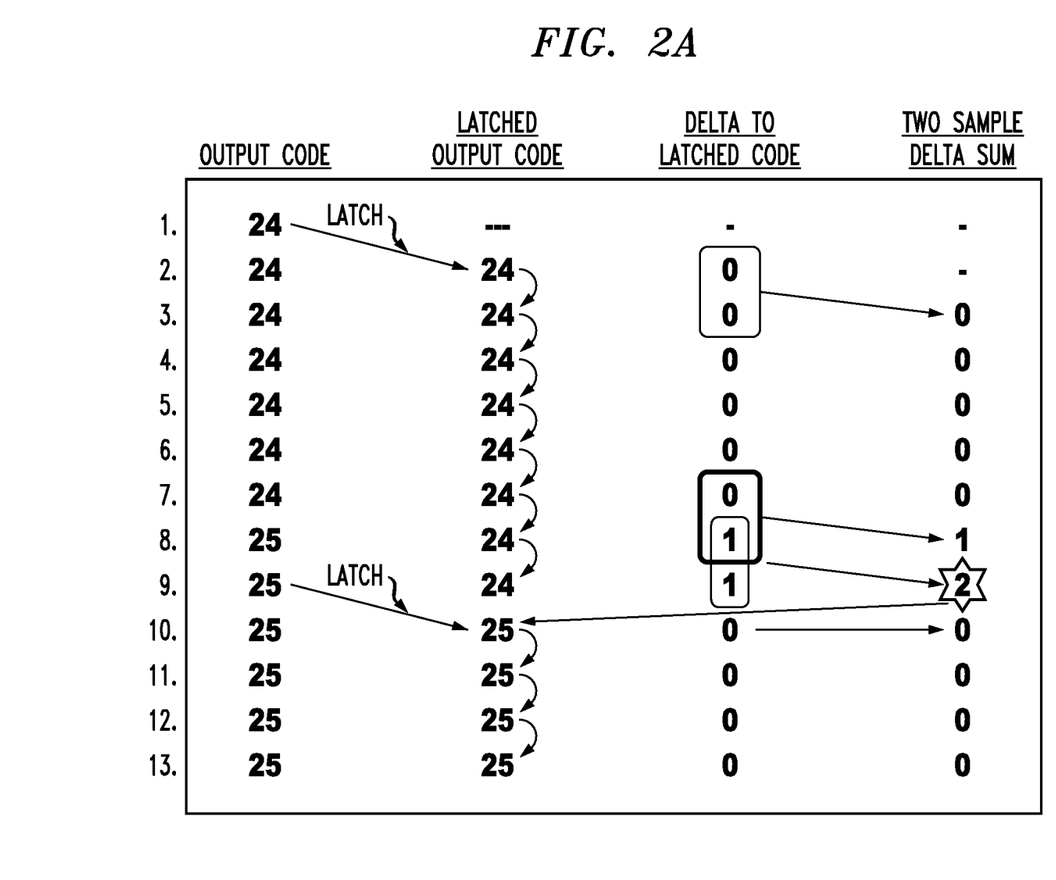
FIGS. 2A-2D illustrate an embodiment of an idle tone killing digital filtering methodology.

An idle tone killing methodology according to one embodiment is illustrated in connection with FIG. 2A. FIG. 2A is a table having thirteen rows and four columns. The first column—"Output Code"—represents the digital output code from the Accumulate and Dump block of the temperature sensor of FIG. 1. The second column—"Latched Output Code"—represents the digital output code that is outputted in accordance with the method from the Idle Tone Killer block. This output either corresponds to the present digital code (from column "Output Code") or to the previous digital code (from column "Output Code") as will be described in more detail below. The third column—"Delta to Latched Code"—represents the difference between the output code value (column 1) and the latched output code (column 2) for a given row. Finally, the fourth column—"Two Sample Delta Sum"—represents the sum of the delta to latched code value (column 3) from the present row and previous row, unless reset as described below.

In row 1, the first output code (24) is provided to the idle tone killer.

In row 2, the first code (24) is latched to be the output of the idle tone killer (column 2), and the second output code (also 24) is provided to the idle tone killer (column 1). The column 1 and column 2 values are compared. If they are the same, the delta between them is 0 (column 3).

In row 3, the third output code (24) is provided (column 1, row 3). The latched output code remains the same (24) (column 2, row 3). That is, there is no latching or updating of the latched output code value, i.e., the latched output does not change.

In row 3, the third output code (24) is compared with the value in the latch (24) (column 2, row 3). Again, the delta is 0 (column 3, row 3). The delta from row 2, column 3 is added to the delta in row 3, column 3 and reflected in row 3, column 4 (i.e., 0+0=0).

In row 4, the fourth output code (24) is compared with the value in the latch (24) (column 2, row 4). Again, the delta is 0 (column 3, row 4). The delta from column 3, row 3 is added to the delta from column 3, row 4 for a total of 0. This value is shown in column 4, row 4

This process is repeated for each row.

Moving ahead to row 8, which reflects the first changed code (25) (column 1, row 8), this new code (25) is compared to the latched code (24) (column 2, row 8). The delta is 1 (column 3, row 8). The delta from the previous comparison (column 3, row 7) and the latest delta (column 3, row 8) are summed and the result is 1 (i.e., 0+1=1), which is shown in column 4, row 8. In this embodiment, latching does not occur unless the two sample delta sum value (column 4) is 2 or greater. Therefore the latched value (24) at the next row (column 2, row 9) does not change (i.e., no latching/updating occurs).

Turning to row 9, which reflects that the code is again 25 (column 1, row 9), the new code (25) is compared to the latched code (24) (column 2, row 9). The delta is again 1 (column 3, line 9). The previous delta (column 3, row 8) is added to the current delta (column 3, row 9) for a total of 2 (i.e., 1+1=2) (column 4, row 9). Because this value is 2 or greater, the idle tone killer latches the new value 25 (from column 1, row 9), which is shown in column 2, row 10.

Turning to row 10, the new delta-sigma code is again 25 (column 1, row 10). This code (25) is compared to the latched code (25) (column 2, row 10) and the delta is 0. Since the idle tone killer latched the output code, the two sample delta value (column 4, row 10) is set initially to the delta to latched code value (column 3, row 10) rather than the sum of the delta to latched code values from rows 9 and 10. Since this value is 0, the two sample delta sum value is set to 0 (column 4, row 10). This process continues for the remainder of the rows as described herebefore.

Figure 2B:
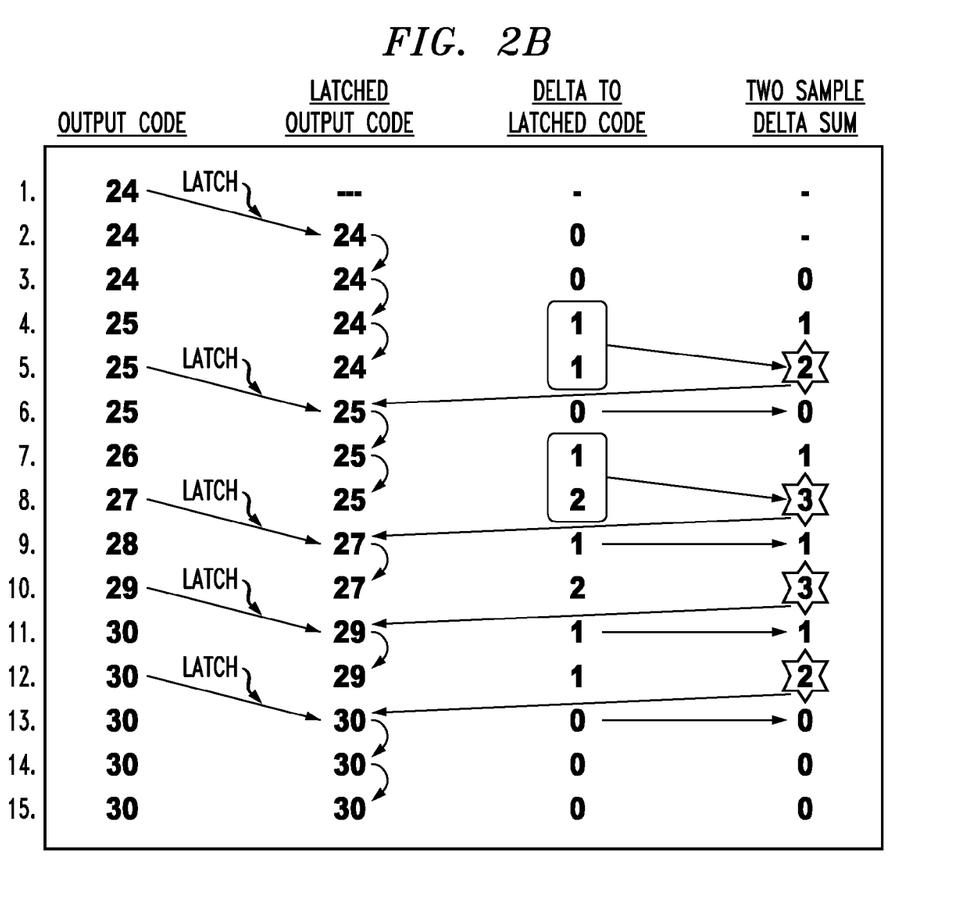

FIG. 2B illustrates the methodology using a different output code sequence. The output codes of first three rows are the same as in FIG. 2A and are not described again. Turning to row 4, the new output code is 25 (column 1, row 4). The delta between the new output code and the value of the latched output code is 1 (column 3, row 4). And the sum of the previous and present delta (column 3, rows 3 and 4) is 1 (column 4, row 4). Because this value is not two or greater, the latched output value is not updated (column 2, row 5).

Turning to row 5, the output code is again 25 (column 1, row 5). The difference between this value and the latched output code (column 2, row 5) is 1 (column 3, row 5). The sum of this delta and the previous delta (column 3, rows 4 and 5) is 2 (column 4, row 5). This value causes the Idle Tone killer to latch the present output code (column 1, row 5) as the latched output code (column 2, row 6).

Turning to row 6, the output code does not change (column 1, row 6). The delta between the present output code and the present latched output code is 0 (column 3, row 6). Since the idle tone killer latched the output code, the two sample delta value (column 4, row 6) is set initially to the delta to latched code value (column 3, row 6) rather than the sum of the delta to latched code values from rows 5 and 6. Since this value is 0, the two sample delta sum value is set to 0 (column 4, row 6). Therefore, the latched output code (column 2, row 7) is not updated and remains 25.

At row 7, the new output code is 26 (column 1, row 7). The delta between this present output code (25) and the latched output code (column 2, row 7) is 1 (column 3, row 7). The sum of the this delta with the previous delta value (i.e., column 3, rows 6 and 7) is 1 (column 4, row 7). Therefore, the latched output code (column 2, row 8) is not updated and remains 25.

At row 8, the new output code is 27 (column 1, row 8). The delta between the present output code (27) and the latched output code (25) (column 2, row 8) is 2 (column 3, row 8). The sum of this delta with the previous delta value (i.e., column 3, rows 7 and 8) is 3 (column 4, row 8). Therefore, the latched output code updates to 27 (column 2, row 9). This process continues for the remainder of the rows as described herebefore.

Note that it is acceptable that the code value 28 from row 9 is never latched as the latched output code, i.e., it is filtered out. The latched output code properly settles and remains at 30.

Figure 2C:
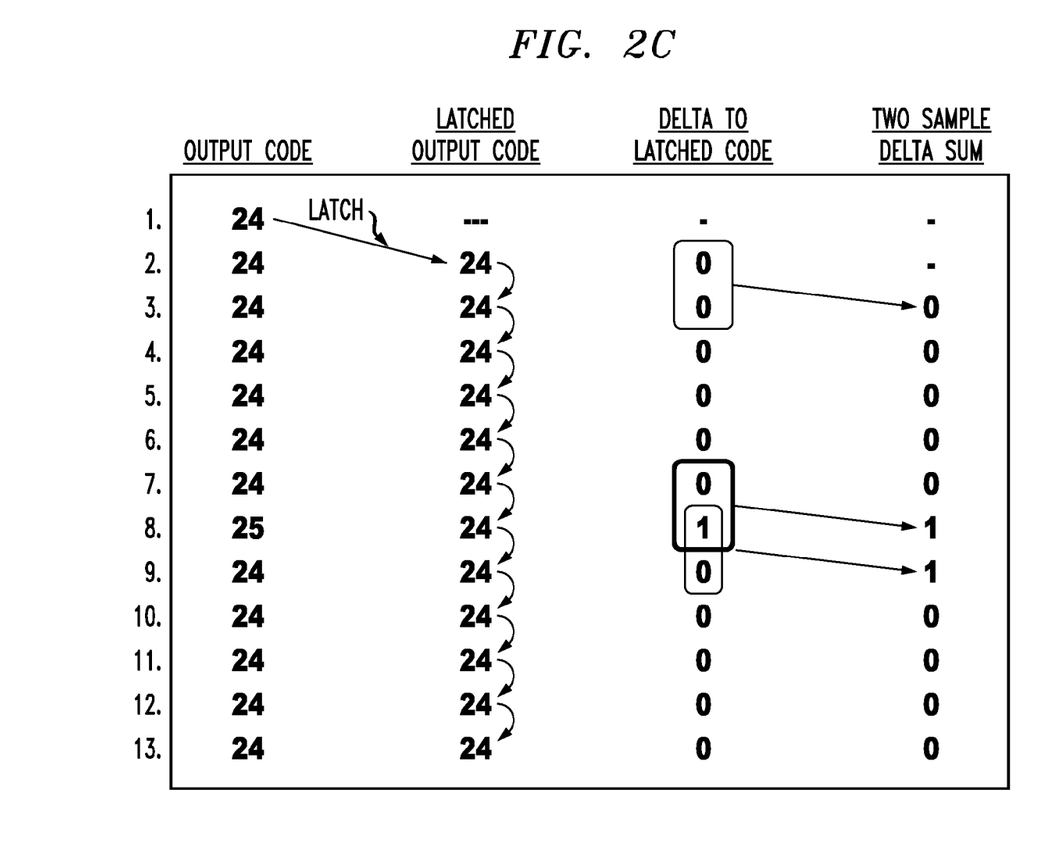

FIG. 2C illustrates the methodology using yet another different output code sequence. This output code sequence shows a "blip' at row 8. As can be seen from rows 7 and 9, the output code of 25 appears only at row 8. It is presumed, therefore, that this passing change to the output code was the result of an artifact from the sampling and quantization processing. This "blip" is considered an idle tone and is therefore filtered from the final output value. As can be seen in column 4, the two sample delta value never reaches 2. Therefore, apart from the latching of the initial value (column 1, row 1) to the latched output (column 2, row 2), the latched output never updates. (columns 2, rows 3 to 13).

Figure 2D:
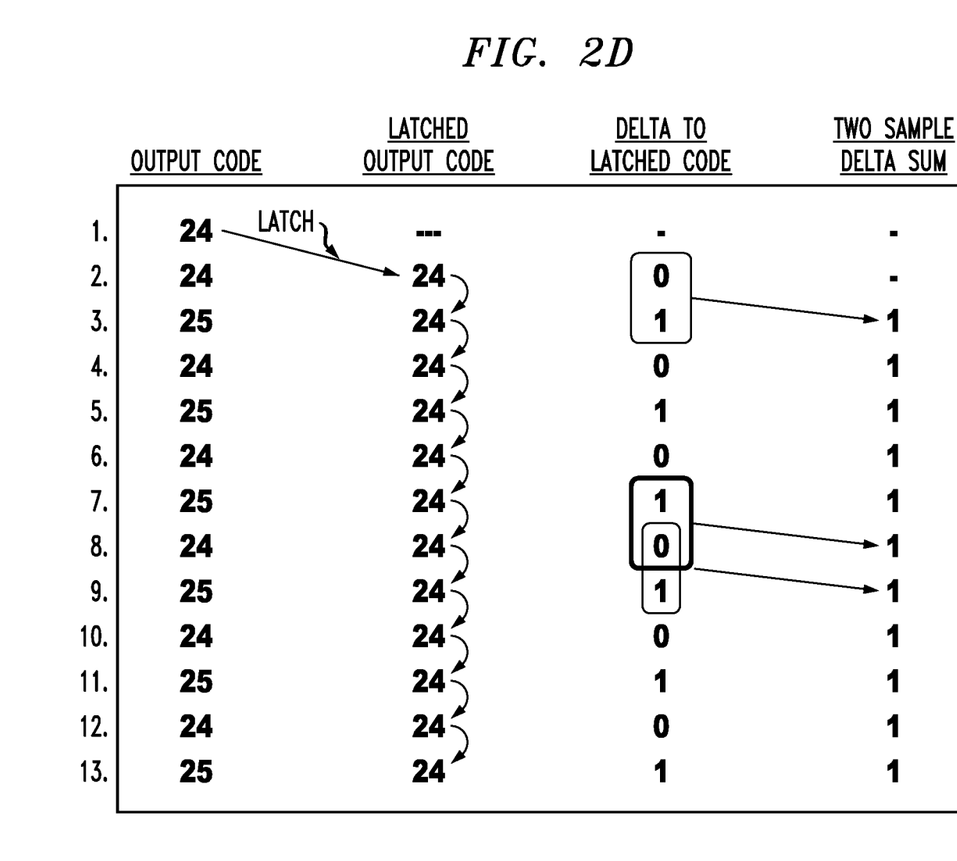

FIG. 2D illustrates this methodology under the worst case scenario—where the output code from is toggling between two values due to artifacts. In this situation, again, it can be seen in column 4 that the two sample delta value never reaches 2. Therefore, apart from the latching of the initial value (column 1, row 1) to the latched output (column 2, row 2), the latched output never updates. (columns 2, rows 3 to 13).

Figure 3:
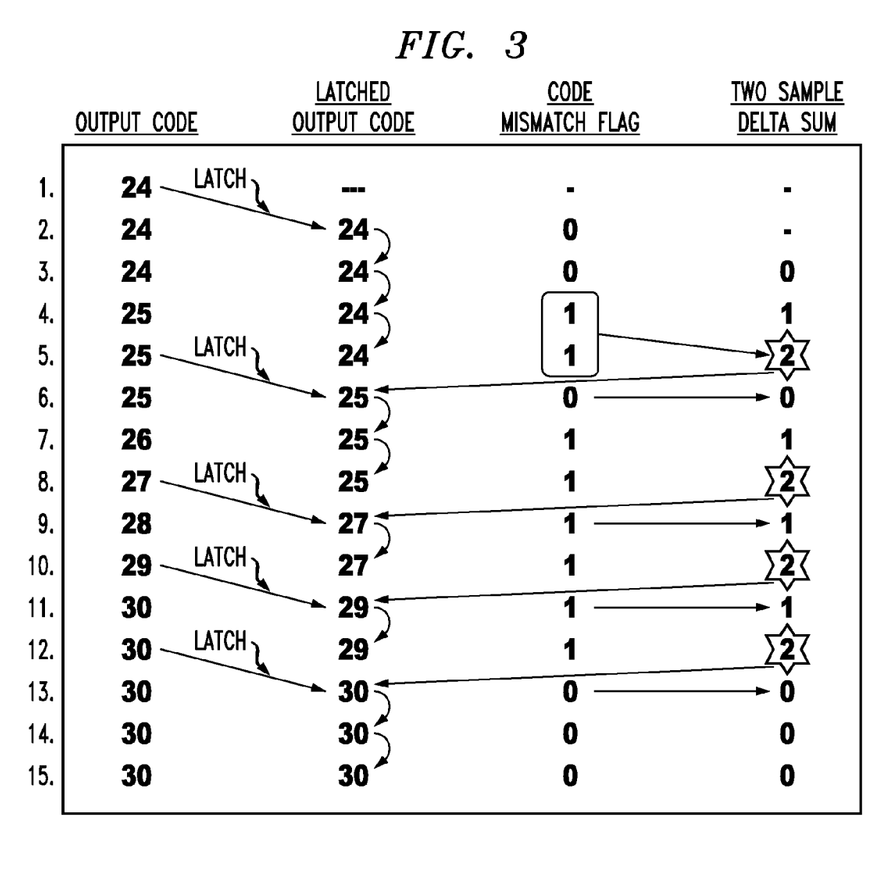
FIG. 3 illustrates another embodiment of an idle tone killing digital filtering methodology.

FIG. 3 illustrates an embodiment of an alternative tone killing scheme. This embodiment uses a "code mismatch flag" (Column 3), which represents simply if there is a difference between the latched output code and new code and not the actual delta therebetween. Implementation of this embodiment may simplify the logic structure of the sensor as simpler comparison logic may be implemented. This embodiment is illustrated using the same output code sequence as shown in FIG. 2B.

Turning to rows 2 and 3, rows 2 and 3 show no difference between the code values in columns 1 and 2, so the code mismatch flag is set to "0". Rows 4 and 5 both show code mismatch flags set to "1" since the column 1 values (25) are each different than the column 2 values (24). Column 4 tallies the number of consecutive code mismatch flags. Once the tally hits "2", representing two consecutive code mismatch flags, the latched output code is updated with the present output code. For example, the latched output code of row 6 (25) (column 2, row 6) is updated with the present code (25) (column 1, row 5). Similar updates occur at rows 9, 11 and 13, which are set to the output code values from column 1, rows 8, 10 and 12, respectively. After each latch operation, the value in column 4 is reset to the value in the corresponding wrong code flag column (e.g., see rows 6, 9, 11 and 13.

Figure 4:
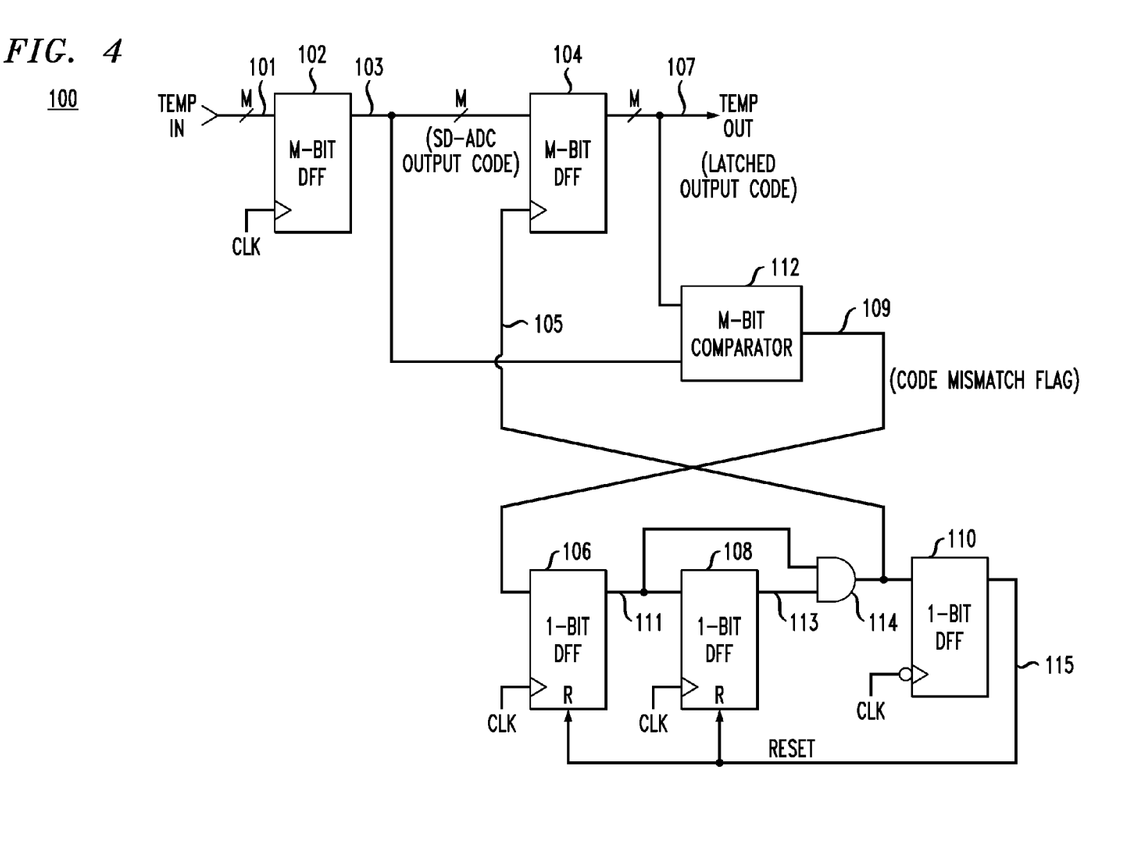
FIG. 4 illustrates an embodiment of an idle tone killer for implementing the methodology of FIG. 3.

FIG. 4 illustrates an embodiment of an idle tone killer 100 using interconnected multi-bit D-flip-flops 102, 104, single-bit D-flip-flops 106, 108, 110, a multi-bit comparator 112 and AND logic gate 114 for implementing the tone killing scheme described above in connection with FIG. 3. A M-bit output code 101 is provided to the input of the D-flip-flop 102. This M-bit code 101 corresponds to the output of the Accumulate and Dump block of FIG. 1. The M-bit output 103 of the D-flip-flop 102 is coupled to the input of the second M-bit D-flip-flop 104. The D-flip-flop 102 passes the input 101 to the output 103 when triggered by the rising edge of the clock signal CLK. M-bit D-flip-flop 104 is controlled not by the clock signal CLK but rather by latch control signal 105 discussed in more detail below. The M-bit output 107 from D-flip-flop 104 represents the latched output code (column 2) of FIG. 3. The M-bit comparator 112 takes as inputs the M-bit output 103 from the first D-flip-flop 102 and the M-bit output 107 from the second D-flip-flop 104. The comparator 112 compares the two codes 103 and 107 and provides an output 109 representing a match (e.g., logical "0") or a mismatch (e.g., logical "1"). This output 109 corresponds to the Code Mismatch Flag of FIG. 3. The signal 109 is provided to the input of one-bit D-flip-flop 106. The one-bit D-flip-flop 106 is toggled by clock signal CLK and has an output 111 connected to the input of the second one-bit D-flip-flop 108, which is also toggled by clock signal CLK. The one-bit D-flip-flop 108 provides output 113. Outputs 111 and 113 are coupled to the inputs of the AND logic gate 114, which provides the latch control signal 105 at its output. The D-flip-flops 106, 108 and AND logic gage 114 basically operate to establish a count of consecutive clock cycles for which the code mismatch flag is set and output the latch control signal if the count hits two. Latch control signal 105 is also provided to input of third one-bit D-flip-flop 110, which is also toggled by clock signal CLK. The output of the one-bit D-flip-flop 110 provides a RESET signal for the D-flip-flops 106, 108 for resetting the flip-flops.

As should be apparent from FIG. 4, M-bit D-flip flip 104 only latches output code 103 to output 107 when signal 105 is logical high. Signal 105 is logical high when the output of the AND logic gate 114 is logical high. This occurs when the Code Mismatch Flag (i.e., signal 109) is logical high for two consecutive clock cycles. As such, the M-bit D flip-flop 104 only latches its input to its output when there are two consecutive (i.e., two clock cycles in a row) mismatches between M-bit code 103 and M-bit code 107. It should also be clear that in the next cycle, the logical high Code Mismatch Flag 105 is latched to the output 115 of the third one-bit flip-flop 110, which resets flip-flops 106, 108, implementing the reset operation described above in connection with FIG. 3.

It should be understood that the circuit of FIG. 4 is designed to trigger latching by the second multi-bit flip flop 104, but the circuit could easily be modified to require more than two consecutive flags (e.g., three flags) before triggering the latch control signal. Such modifications would be apparent to those of ordinary skill in this art based on the teachings of FIG. 4.

Figure 5:
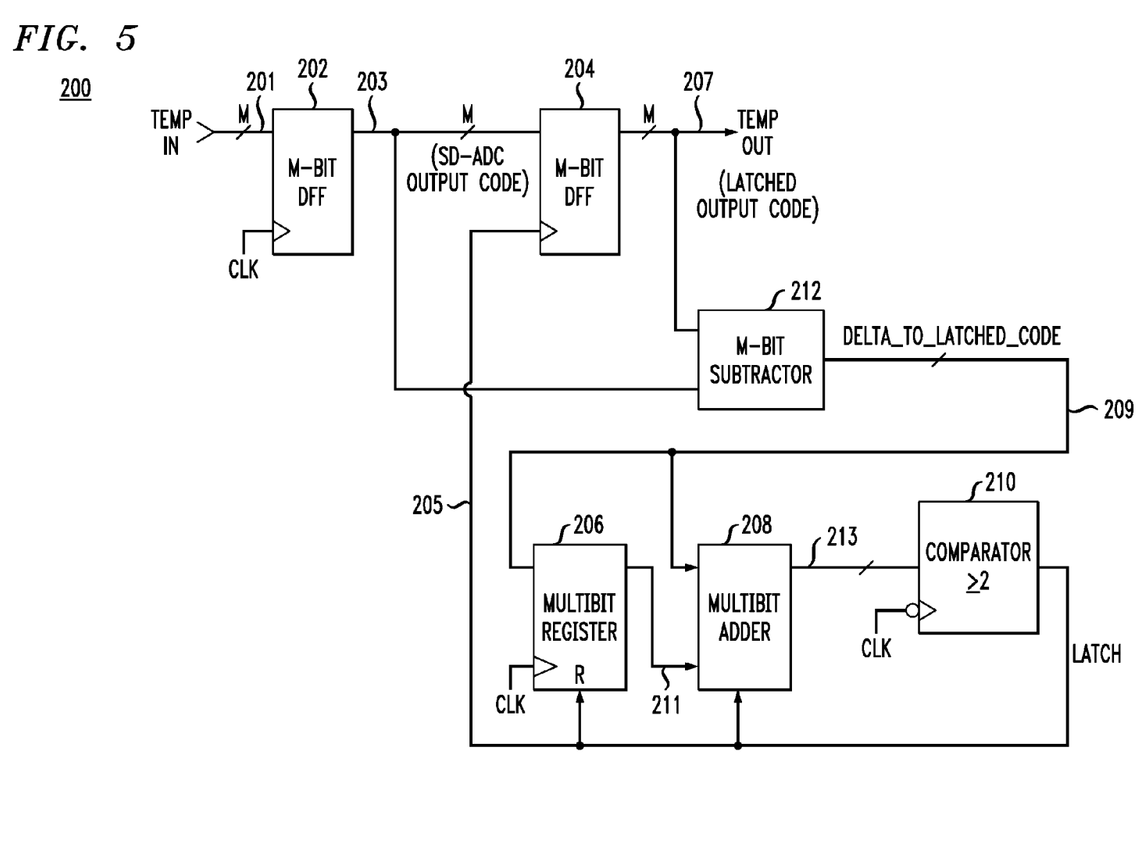
FIG. 5 illustrates an embodiment of an idle tone killer for implementing the methodology of FIGS. 2A-2D.

FIG. 5 illustrates an embodiment of an idle tone killer 200 using interconnected multi-bit D-flip-flops 202, 204, multi-bit register 206, which may also be a multi-bit D-flip flip, multi-bit adder 208, comparator 210 and multi-bit subtractor 212 for implementing the tone killing scheme described above in connection with FIGS. 2A-2D. A M-bit output code 201 is provided to the input of the M-bit D-flip-flop 202. This M-bit code 201 corresponds to the output of the Accumulate and Dump block of FIG. 1. The M-bit output 203 of the D-flip-flop 202 is coupled to the input of the second M-bit D-flip-flop 204. The D-flip-flop 202 passes the input 201 to the output 203 when triggered by the rising edge of the clock signal CLK. M-bit D-flip-flop 204 is controlled not by the clock signal CLK but rather by latch control signal 205 discussed in more detail below. The M-bit output 207 from D-flip-flop 204 represents the latched output code (column 2) of FIGS. 2A-2D. The M-bit subtractor 212 takes as inputs the M-bit output 203 from the first D-flip-flop 202 and the M-bit output 207 from the second D-flip-flop 204. The subtractor 212 subtracts between the two codes 203 and 207 and provides a multi-bit output 209 representing a difference code between the two inputs. This difference code 209 corresponds to the Delta to Latched code (column 3) of FIGS. 2A-2D. The difference code 209 is provided to the input of multi-bit register 206. The output 211 of the multi-bit register 211 is coupled to multi-bit adder 208, along with the code 209. Basically, multi-bit adder 208 sums the difference code for two consecutive clock cycles and provides output 213 representing that sum and corresponds to the values in column 4 (Two Sample Delta Sum) of FIGS. 2A-2D. Sum code 213 is provided to a comparator 210, which is configured to output latch control signal 205 when sum code 213 is greater than or equal to 2. It should be noted that this latch control signal 205 also resets multi-bit register 206.

As should be apparent from FIG. 5, M-bit D-flip flip 204 only latches output code 203 to output 207 when signal 205 is logical high. Signal 205 is logical high when the output of the comparator 210 is logical high. This occurs only when the sum of two consecutive difference codes 209 is two or greater.

Figure 6:
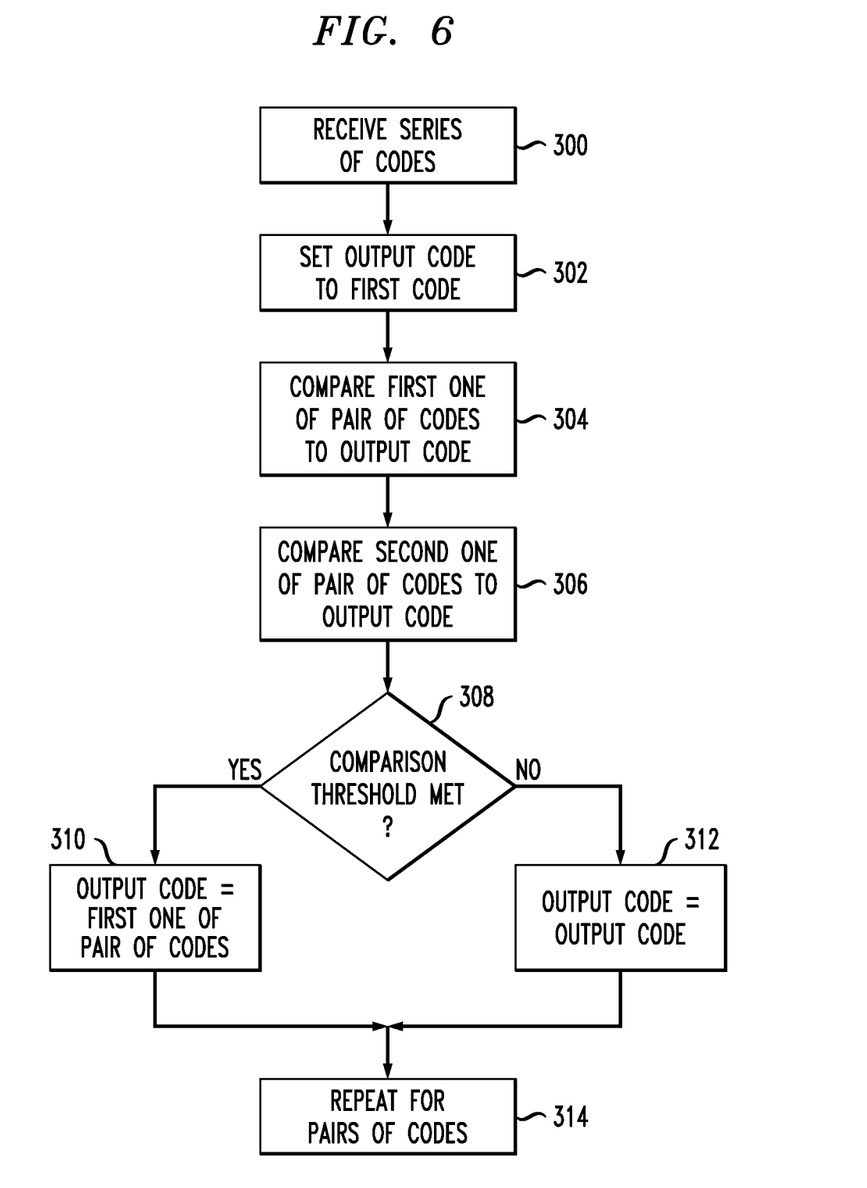
FIG. 6 illustrates an embodiment of a digital filtering methodology.

FIG. 6 illustrates a method of digital filtering in accordance with various embodiments. At step 300, a series of multi-bit sigma-delta ADC codes is received, sequentially. Each code defines a pair of codes with a code preceding it in the series of codes and defining a pair of codes with a code following it in the series of codes, i.e., code[i] forms a pair of codes with code[i−1] and with code[i+1], etc. in a series {code[i], where i=0 to infinity. The output code of the digital filtering methodology is initially set to the first code (e.g., code[0]) (step 302). The first one of a pair of codes (e.g., code[1] of code pair codes[1,2]) is compared to the output code (step 304). The second one of a pair of codes (e.g., code[2]) is compared to the output code (step 306). At step 308, it is determined if a comparison threshold is met (e.g., are there two consecutive mismatch flags (see FIG. 3) or is the sum of the code deltas 2 or greater (see FIGS. 2A-2D). At step 310, the output code is update, i.e., set to the first one of the pair of codes (e.g., code[1] if the mismatch threshold is met. Otherwise, at step 312, the output code is unchanged. As reflected in step 314, this process is repeated for pairs of codes in the series of codes.

As described above, various embodiments provide a simple hysteretic digital filter that can be used to filter out artifacts from sigma-delta analog-to-digital converters used in silicon sensors. The circuitry is small, requiring very little logic to implement. Moreover, the approach is very low power, requiring very little computational resources.

In various embodiments disclosed herein, a hysteretic digital filter is provided for filtering artifacts from an output of a sigma-delta analog-to-digital converter (ADC). The filter includes a first multi-bit flip-flop having an input for receiving a series of multi-bit sigma-delta ADC codes, a clock input for receiving a clock signal and an output, the first multi-bit flip flop latching the multi-bit sigma-delta codes to its output under control of the clock signal; a second multi-bit flip-flop having an input coupled to the output of the first multi-bit flip-flop, an output for providing an output code of the digital filter, and an input for receiving a latch control signal, the second multi-bit flip-flop latching its input to its output under control of the latch control signal; and a control circuit for providing the latch control signal. The control circuit is configured to selectively provide the latch control signal to trigger latching by the second multi-bit flip-flop dependent on a running comparison of the output code of the digital filter and the value of individual ones of the multi-bit sigma-delta ADC codes from the series of multi-bit sigma-delta ADC codes.

In an embodiment of a method for filtering artifacts from outputs of a sigma-delta analog-to-digital converter (ADC), the method includes the steps of receiving in sequence a series of multi-bit sigma-delta ADC codes, each code defining a pair of codes with a code preceding it in the series of codes and defining a pair of codes with a code following it in the series of codes; setting an output code to a first one of the codes in the series of codes; and for pairs of codes following the first one of the codes, performing the following steps: comparing a first one of the pair of codes to the output code; comparing a second one of the pair of codes to the output code; and based on the comparing steps, selectively either maintaining the output code as its present code value or setting the output code to the first one of the pair of codes.

Although the embodiments has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A hysteretic digital filter for filtering artifacts from an output of a sigma-delta analog-to-digital converter (ADC), comprising:
   a first multi-bit flip-flop having an input for receiving a series of multi-bit sigma-delta ADC codes, a clock input for receiving a clock signal and an output, the first multi-bit flip flop latching the multi-bit sigma-delta ADC codes to its output under control of the clock signal;
   a second multi-bit flip-flop having an input coupled to the output of the first multi-bit flip-flop, an output for providing an output code of the digital filter, and an input for receiving a latch control signal, the second multi-bit flip-flop latching its input to its output under control of the latch control signal; and
   a control circuit for providing the latch control signal, wherein the control circuit is configured to selectively provide the latch control signal to trigger latching by the second multi-bit flip-flop dependent on a running comparison of the output code of the digital filter and the value of individual ones of the multi-bit sigma-delta ADC codes from the series of multi-bit sigma-delta ADC codes.

2. The hysteretic digital filter of claim 1, wherein the control circuit comprises a comparator for comparing the present one of the multi-bit sigma-delta ADC codes and the output code of the digital filter and outputting a code mismatch flag representing a mismatch between multi-bit sigma-delta ADC codes and the output code of the digital filter.

3. The hysteretic digital filter of claim 2, wherein the control circuit is configured to provide the latch control signal to trigger latching by the second multi-bit flip-flop based on code mismatch flags for at least two consecutive clock cycles.

4. The hysteretic digital filter of claim 3, wherein the control circuit further comprises:
   a third flip-flop having an input coupled to an output of the comparator, a clock input for receiving the clock signal and an output, the third flip-flop latching its input to its output under control of the clock signal;
   a fourth flip-flop having an input coupled to the output of the third flip-flop, a clock input for receiving the clock signal and an output, the fourth flip-flop latching its input to its output under control of the clock signal; and
   a logic AND gate having first and second inputs coupled to the outputs of the third and fourth flip-flops, respectively, and an output for providing the latch control signal.

5. The hysteretic digital filter of claim 4, further comprising a fifth flip-flop for providing a reset signal for the third and fourth flip-flops responsive to the latch control signal.

6. The hysteretic digital filter of claim 5, wherein the fifth flip-flop has an input coupled to the output of the logic AND gate, a clock input for receiving the clock signal and an output coupled to reset inputs of the third and fourth flip-flops, the fifth flip-flop latching its input to its output under control of the clock signal.

7. The hysteretic digital filter of claim 1, wherein the control circuit comprises a multi-bit subtractor for determining a difference between the present one of the multi-bit sigma-delta ADC codes and the output code of the digital filter and outputting a difference code representing the difference.

8. The hysteretic digital filter of claim 7, wherein the control circuit is configured to provide the latch control signal to trigger latching by the second multi-bit flip-flop based on a sum of the differences for two consecutive clock cycles being at least a predetermined value.

9. The hysteretic digital filter of claim 8, wherein the control circuit further comprises:
   a multi-bit register having an input coupled to an output of the subtractor, a clock input for receiving the clock signal and an output;
   an adder having a first input coupled to the output of the register, a second input coupled to the output of the subtractor, an output; and
   a comparator circuit configured to compare the output of the adder to the predetermined value and provide the latch control signal based on the comparison.

10. The hysteretic digital filter of claim 9, wherein the multi-bit register has a reset input coupled to an output of the comparator.

11. The hysteretic digital filter of claim 8, wherein the predetermined value is 2.

12. A method for filtering artifacts from outputs of a sigma-delta analog-to-digital converter (ADC), comprising the steps of:
   receiving in sequence a series of multi-bit sigma-delta ADC codes, each code defining a pair of codes with a code preceding it in the series of codes and defining a pair of codes with a code following it in the series of codes;
   setting an output code to a first one of the codes in the series of codes; and
   for pairs of codes following the first one of the codes, performing the following steps:
      comparing a first one of the pair of codes to the output code;
      comparing a second one of the pair of codes to the output code; and based on the comparing steps, selectively either maintaining the output code as its present code value or setting the output code to the first one of the pair of codes.

13. The method of claim 12,
wherein the step of selectively either maintaining the output code or setting the output code includes the steps of:
setting the output code to the first one of the pair of codes if both codes in the pair of codes are different than the output code; and
maintaining the output code at its present code value if both codes in the pair of codes are not different than the output code.

14. The method of claim 12,
wherein each comparing step includes the step of setting a code mismatch flag if there is a mismatch between the compared codes; and
wherein the step of selectively either maintaining the output code or setting the output code includes the steps of setting the output code when the code mismatch flag is set for two consecutive clock cycles and otherwise maintaining the output code at its present code value.

15. The method of claim 14, further comprising the step of maintaining a count of consecutive clock cycles for which the code mismatch flag is set and clearing the count upon setting the output code to the first one of the pair of output codes.

16. The method of claim 12, wherein the steps of comparing the first and second ones of the pairs of codes to the output code includes determining a difference between the values of the codes.

17. The method of claim 16, wherein the step of selectively either maintaining the output code or setting the output code includes the steps of:
adding the determined differences from the comparing steps; and
setting the output code when a sum of the determined differences is at least a predetermined value and otherwise maintaining the output code at its present code value.

18. The method of claim 17, wherein the predetermined value is two.

19. The method of claim 18, wherein the comparing steps are performed in consecutive clock cycles, the method further comprising the steps:
during a first clock cycle storing a result of comparing the first one of the pair of codes to the output code in a register; and
during a second clock cycle, outputting the stored result, and inputting to the register for storing a result of comparing the second one of the pair of codes to the output code;
wherein the adding step is performed using an adder having as inputs the codes outputted from and inputted to the register during the second clock cycle.

20. The method of claim 19, further comprising the step of clearing the register upon setting the output code to the first one of the pair of output codes.

* * * * *